US005254505A

United States Patent [19]

Kamiyama

[11] Patent Number: 5,254,505
[45] Date of Patent: Oct. 19, 1993

[54] PROCESS OF FORMING CAPACITIVE INSULATING FILM

[75] Inventor: Satoshi Kamiyama, Tokyo, Japan
[73] Assignee: NEC Corporation, Tokyo, Japan
[21] Appl. No.: 753,765
[22] Filed: Sep. 3, 1991
[30] Foreign Application Priority Data
  Aug. 31, 1990 [JP] Japan .................... 2-231661
[51] Int. Cl.$^5$ .................... H01L 21/02; B05D 5/12
[52] U.S. Cl. .................... 437/235; 427/124; 427/126.3; 437/919
[58] Field of Search ............ 437/245, 235; 427/124, 427/126.3

[56] References Cited

FOREIGN PATENT DOCUMENTS 0388957  9/1990  European Pat. Off. .
60-028259  2/1985  Japan .
1-189129  7/1989  Japan .

OTHER PUBLICATIONS

"Highly Reliable 2.5nm Ta$_2$O$_5$ Capacitor Process Technology for 256Mbit DRAMS", S. Kamiyama, T. Saeki, H. Mori, and Y. Numasawa, NEC Corporation, VLSI Development Division, Sagamihara, Kanagawa 229 Japan, IDEM Tech Dig. 1991, pp. 827-830.
Zaima et al, "Preparation and Properties of Ta$_2$O$_5$ Films by LPCVD for ULSI Application", Journal of the Electrochemical Society, vol. 137, No. 4, Apr. 1990, pp. 1297-1300.
Watanabe et al, "Ta-O (At-oxide) and Nb-O (Nb-oxide) Film . . . Electron Cyclotron Resonance Plasma", Japanese Journal of Applied Physics, vol. 24, No. 6, Jun. 1985, pp. 411-413.
"Thin Dielectric Oxide Films Made by Oxygen Assisted Pyrolysis of Alkoxides", S. Pakswer and P. Skoug; Second International Conference on CVD, Los Angeles, Calif., May 1970, The Electrochemical Society, Inc. 1970, pp. 619-636.
"Photo-CVD of Tantalum Oxide Film from Pentamethoxy Tantalum for VLSI Dynamic Memories", K. Yamagishi and Y. Tarui, JJAP, vol. 25 No. 4, 1986, pp. L306-L308.

Primary Examiner—Olik Chaudhuri
Assistant Examiner—Ramamohan Rao Paladugu
Attorney, Agent, or Firm—Sughrue, Mion, Zinn, Macpeak & Seas

[57] ABSTRACT

A process of forming a capacitive insulating film comprises the steps of forming a tantalum oxide film through thermochemical reaction involving organic tantalum charge gas and oxygen gas, and subsequently forming a tantalum oxide film through plasma chemical reaction involving tantalum halogenide charge gas and nitrous oxide (N$_2$O) gas, said steps being performed in the same apparatus.

3 Claims, 5 Drawing Sheets

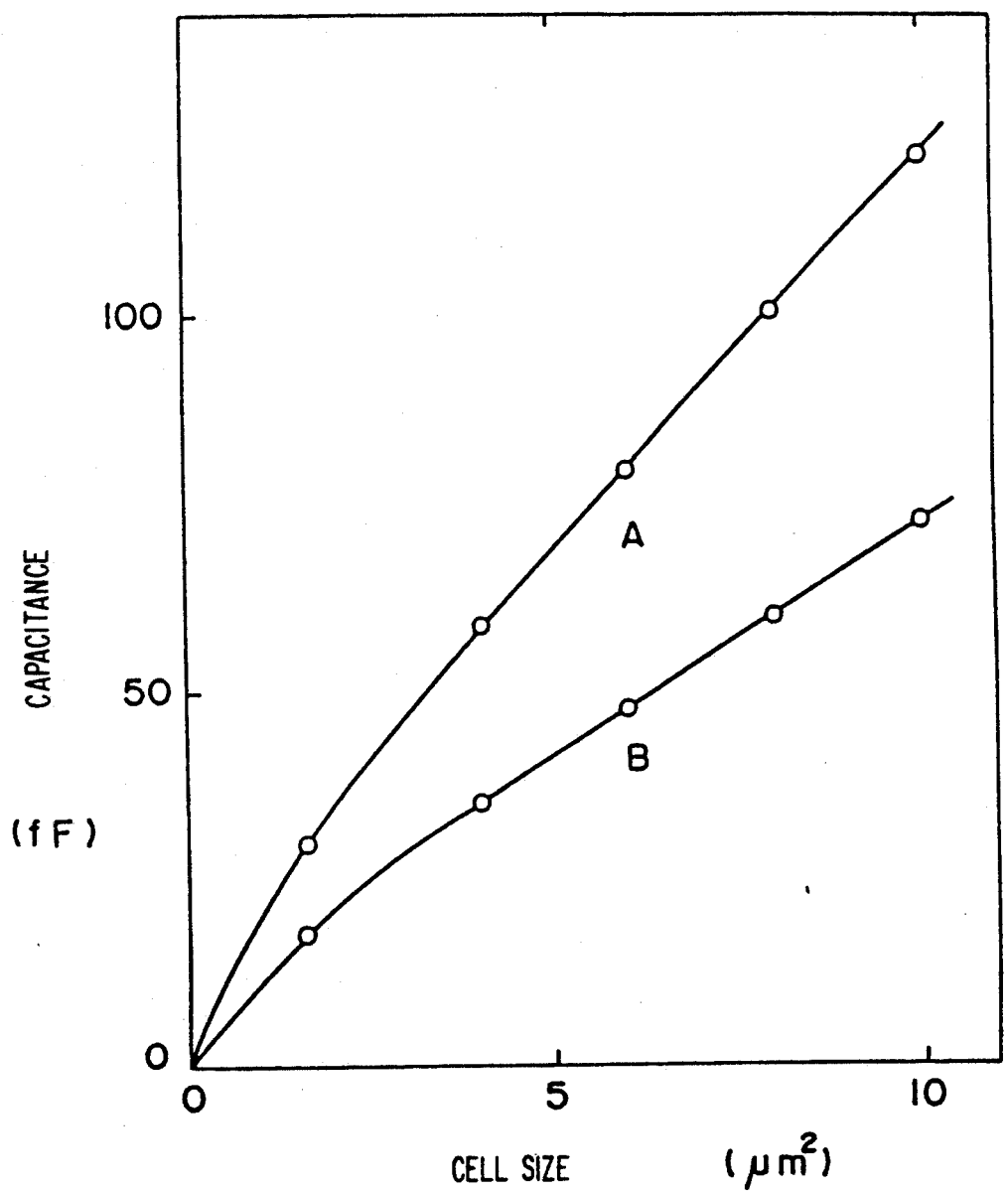

PROCESS OF FORMING CAPACITIVE INSULATING FILM

BACKGROUND OF THE INVENTION

Field of the Invention

The present invention relates to a process of forming a capacitive insulating film comprising an tantalum oxide, which makes up a semiconductor memory device.

Description of the Related Art

In a DRAM device, the amount of signal charge per memory cell (about 30 fF/cell) cannot be reduced by cell microminiaturization in order to prevent software errors due to α rays. It is therefore necessary to have a three-dimensional structure, such as a stack structure or a trench structure, or to adopt a film of high dielectric constant in order to realize VLSI DRAMs having a 64-M size or greater. A tantalum oxide film has been particularly noted as a film of high dielectric constant, and has been studied extensively. Conventionally, this tantalum oxide film is formed through plasma chemical reaction involving tantalum chloride (TaCl$_5$) gas and nitrous oxide gas.

FIG. 1 illustrates an apparatus which is used in a conventional process of forming a tantalum oxide film.

In a reaction chamber 62, a substrate holder 61 incorporating a heater 58 is disposed with its wafer-loaded face set horizontally. A gas supply section 72 is located in the reaction chamber 62, facing the substrate holder 61. The gas supply section 72 is linked via a pipe 71 to an inlet pipe 51 for introducing argon gas as carrier gas. The pipe 71 is also linked to a nitrous oxide gas inlet pipe 52, a hydrogen gas inlet pipe 53, a flon gas inlet pipe 54 and another argon gas inlet pipe 55. These pipes 71, 51, 52, 53, 54 and 55 respectively have valves 70, 55, 66, 67, 68 and 69 disposed therealong. To the carrier gas inlet pipe 51 is linked a vaporization chamber 56 for tantalum chloride (TaCl$_5$), downstream of the gas flow from the valve 55. A heater 57 is provided around the vaporization chamber 56 and along the pipes 51 and 71, extending from the chamber 56 to the reaction chamber 62. To the bottom wall of the reaction chamber 62 is linked a pipe 73 which is in turn linked to a vacuum pump 63. Gas sucked into the reaction chamber 62 by the pump 63 therefore flows through the pipe 73 and out from an exhaust vent 64. The substrate holder 61 is grounded, and the gas supplying section 72 opposite to this holder 61 is connected to a high-frequency power supply 59.

A conventional process of forming a tantalum oxide film using thus structured apparatus will now be explained.

The tantalum oxide gas in the vaporization chamber 56, heated by the heater 57, is introduced into the reaction chamber 62, together with argon gas as carrier gas supplied from the pipe 51. Nitrous oxide gas is sent via the valve 66 into the reaction chamber 62. The substrate holder 61 has been heated by the heater 58, so that when the high frequency power supply 59 is turned on, a mixture of the tantalum chloride gas and the nitrous oxide gas, supplied from the gas supply section 72 into the reaction chamber 62, may cause plasma chemical reaction. Thus, a tantalum oxide film is formed on the surface of each silicon substrate on the wafer 60.

The typical growth conditions include a heating temperature of 50° to 300° C. at which the heater 57 heats the tantalum chloride gas pipe, a growth temperature of 100° to 600° C. in the reaction chamber 62 by the heater 58, a flow rate for nitrous oxide gas of 0.1 to 5.0 SLM, a flow rate for argon gas as carrier gas of 5 to 100 SCCM, and a pressure of 0.1 to 10.0 torr. The typical conditions for the high frequency power supply for causing plasma chemical reaction include a frequency of 50 kHz to 13.56 MHz and a power of 30 to 500 W.

The above-described conventional process of forming a tantalum oxide film through plasma chemical reaction however has the following shortcoming.

With microminiaturization of VLSI memories, as described above, it is necessary to employ a three-dimensional structure, such as a stack structure, or to adopt a film of high dielectric constant. For a 64-M DRAM, a tantalum oxide film if used requires a capacitance of at least 10 fF/$\mu^2$ (a film thickness of 35 Å in terms of SiO$_2$ conversion) or greater in order to secure signal charge of about 30 fF per cell area. If a tantalum oxide is formed on a single crystalline silicon substrate or a polycrystalline silicon substrate according to the prior art process, however, a silicon oxide (SiO$_2$) film is formed with a thickness of 30 to 40 Å at the initial stage of the plasma chemical reaction. This is because that with the use of the plasma chemical reaction for forming the film, silicon in the single crystalline silicon substrate or polycrystalline silicon substrate is sputtered by ions or the like in plasma, and the sputtered silicon reacts with nitrous oxide gas to thereby form a silicon oxide (SiO$_2$) film. The capacitance of the tantalum oxide film formed by the prior art process reaches only 7 fF/$\mu^2$ (a film thickness of 50 Å in terms of SiO$_2$ conversion) at most. The prior art process cannot therefore be applied to fabrication of VLSI DRAMs of a 64-M size or greater.

SUMMARY OF THE INVENTION

It is therefore an object of the present invention to provide a process of forming a capacitive insulating film which can form an insulating film having a large capacitance, and can ensure fabrication of VLSI memories.

To achieve this object, a process of forming a capacitive insulating film according to the present invention comprises the steps of forming a tantalum oxide film through thermochemical reaction involving organic tantalum charge gas and oxygen (O$_2$) gas; and subsequently forming a tantalum oxide film through plasma chemical reaction involving tantalum halogenide charge gas and nitrous oxide (N$_2$O) gas, said steps being performed in the same apparatus.

As the two different steps of each forming a tantalum oxide film are carried out in the same apparatus, it is possible to form a capacitive insulating film with a large capacitance, which significantly contributes to realization of VLSI DRAMs of a 64-M size or a greater size.

Since an oxide film formed at the interface between the tantalum oxide film and the substrate is very thin according to this invention, reduction of the dielectric constant can be prevented, thus ensuring formation of a tantalum oxide film with high dielectric constant.

BRIEF DESCRIPTION OF THE DRAWINGS

FIG. 5 is a graph showing changes in capacitance versus the cell size when the capacitive insulating film produced according to this embodiment is applied to a device.

DETAILED DESCRIPTION OF THE PREFERRED EMBODIMENT

Figure 1:
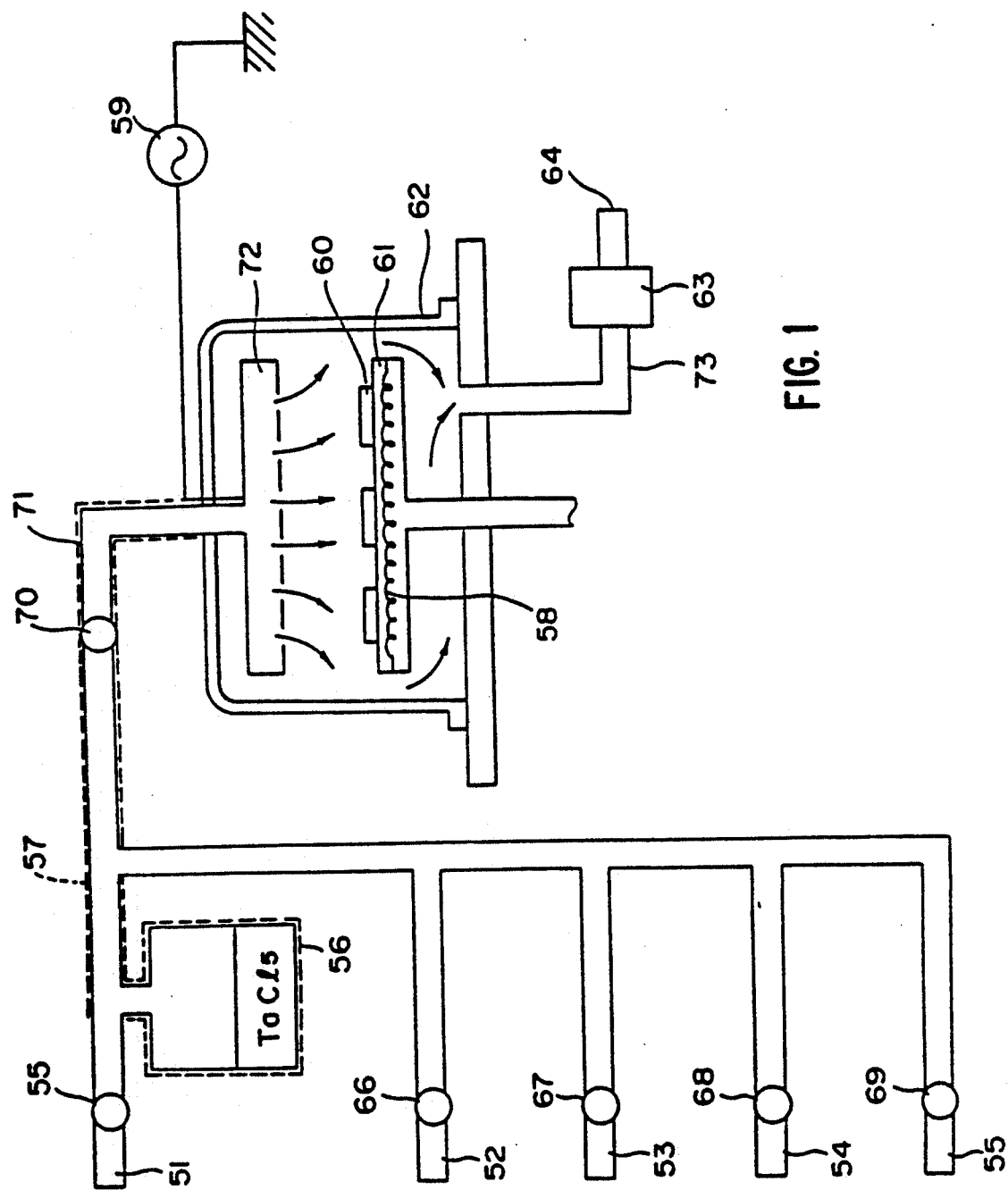
FIG. 1 is an exemplary diagram illustrating a plasma chemical vapor-phase growth apparatus for use in a conventional process of forming a capacitive insulating film.
Figure 2:
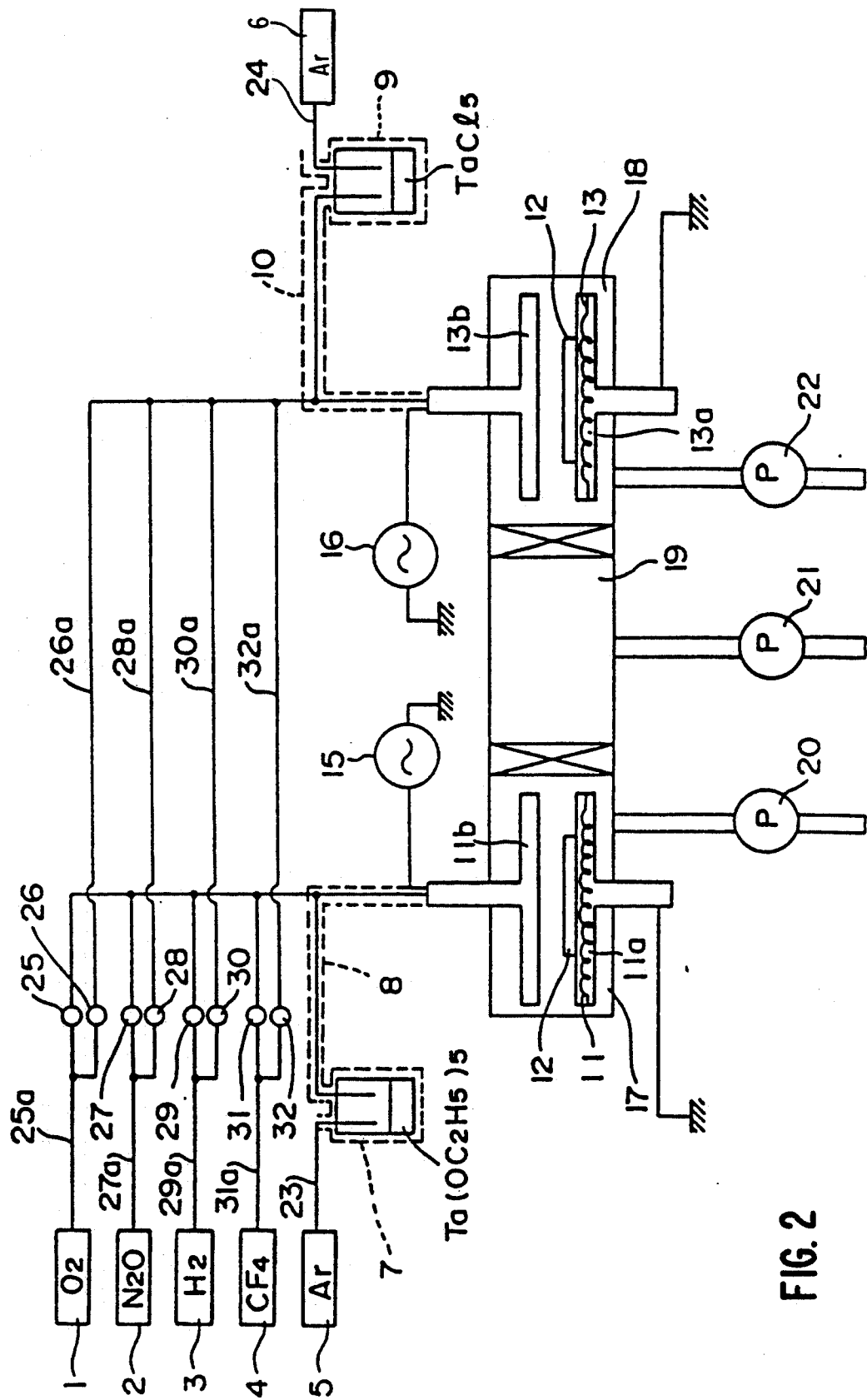
FIG. 2 is an exemplary diagram illustrating an apparatus for forming a capacitive insulating film, which is used in a process according to a first embodiment of the present invention.

A preferred embodiment of the present invention will now be described referring to the accompanying drawings. FIG. 2 is an exemplary diagram illustrating an apparatus for forming a capacitive insulating film, which is used in a process according to the embodiment of the present invention.

A reaction chamber in an apparatus for forming a capacitive insulating film is divided into three compartments by reopenable partition walls. The central compartment is a load lock chamber 19 with reaction chambers 17 and 18 provided on the respective sides. The reaction chambers 17 and 18, and the load lock chamber 19 are exhausted of gas by a vaccum pump 20, 22 and 21, respectively.

Disposed in the reaction chambers 17 and 18 are substrate holders 11a and 13a respectively incorporating heaters 11 and 13. Gas supply sections 11b and 13b are located opposite the substrate holders 11a and 13a, respectively. Wafers 12 are placed on the substrate holders 11a and 13a.

An oxygen gas supply source 1, a $N_2O$ gas supply source 2, a $H_2$ gas supply source 3, a $CF_4$ gas supply source 4 and an Ar gas supply source 5 are linked respectively via trunk pipes 25a, 27a, 29a and 31a, and a branch pipe 23 to the gas supply section 11b. A vaporization chamber 7 for $Ta(OC_2H_5)_5$ gas is located on the way of the pipe 23. A heater 8 is provided around the vaporization chamber 7 and along the pipe 23 which extends from the vaporization chamber 7 to the reaction chamber 17.

The oxygen gas supply source 1, the $N_2O$ gas supply source 2, the $H_2$ gas supply source 3, the $CF_4$ gas supply source 4 and the Ar gas supply source 6 are linked respectively via trunk pipes 26a, 28a, 30a and 32a, and a branch pipe 24 to the gas supply section 13b. A vaporization chamber 9 for $TaCl_5$ gas is located on the way of the pipe 24. A heater 10 is provided around the vaporization chamber 9 and along the pipe 24 which extends from the vaporization chamber 9 to the reaction chamber 18. These pipes 25a, 26a, 27a, 28a, 29a, 30a, 31a and 32a respectively have valves 25, 26, 27, 28, 29, 30, 31 and 32 disposed therealong.

Further the gas supply sections 11b and 13b are connected to high frequency power supplies 15 and 16, respectively.

A process of forming a capacitive insulating film using thus structured apparatus will now be described.

The wafer 12 is moved via the load lock chamber 19 to the reaction chamber 17. Organic tantalum [Ta-$(OC_2H_5)_5$]charge gas in the vaporization chamber 7, heated by the heater 8, is introduced into the reaction chamber 17, together with argon gas as carrier gas supplied from the supply source 5. Oxygen gas from the supply source 1 is supplied to the reaction chamber 17 with the valve 25 open. Since the wafer 12 has been already heated by the heater 11, the heat causes chemical reaction between the introduced organic tantalum $[Ta(OC_2H_5)_5]$gas and the oxygen gas. A tantalum oxide film is thereby formed on the wafer 12.

Then, the wafer 12 is moved via the load lock chamber 19 where high vacuum is kept to the reaction chamber 18. Tantalum halogenide ($TaCl_5$) charge gas in the vaporization chamber 9, heated by the heater 10, is introduced into the reaction chamber 18, together with argon gas as carrier gas supplied from the supply source 6. Nitrous oxide gas from the supply source 2 is supplied to the reaction chamber 18 with the valve 28 open. Since the wafer 12 has been already heated by the heater 13, the heat causes plasma chemical reaction between the introduced tantalum halogenide ($TaCl_5$) charge gas and the nitrous oxide gas. A tantalum oxide film is thereby formed on the wafer 12.

In the above process of forming a tantalum oxide film, introduction of hydrogen gas in forming the tantalum oxide film can improve the quality of the film. Because organic tantalum charge gas or tantalum halogenide charge gas and the introduced hydrogen gas will have chemical reaction with each other, so that the tantalum oxide film can contain less impurity than the film without hydrogen gas introduced.

The typical growth conditions for a tantalum oxide film include a heating temperature of 50° to 300° C. at which the heaters 8 and 10 heat the tantalum gas pipe system, a growth temperature of 100° to 600° C. in the reaction chambers 17 and 18 by the heater 11 and 13, respectively, a flow rate for oxygen gas of 0.1 to 5.0 SLM, a flow rate for nitrous oxide gas of 0.1 to 5.0 SLM, a flow rate for argon gas as carrier gas of 10 to 500 SCCM, and a flow rate for hydrogen gas of 0.01 to 3.0 SLM. The typical conditions for the high frequency power supply for causing plasma chemical reaction include a frequency of 50 kHz to 13.56 MHz and a power of 30 to 500 W. The film-forming conditions are not limited to the above, and other conditions may also provide the effect of this invention.

If the reaction chamber is cleaned by plasma chemical reaction involving a fluorine series halogenide compound, such as fluorocarbon ($CF_4$) gas, the tantalum oxide film can be formed with high reproducibility. There are two cleaning methods: one using only $CF_4$ gas and the other using a mixture of $CF_4$ gas and oxygen gas. A preferable example of the cleaning conditions includes a flow rate for $CF_4$ gas of 0.1 to 50 SLM, a flow rate for oxygen gas of 0.1 to 2.0 SLM, a frequency of the high-frequency power supply to cause plasma chemical reaction of 50 kHz to 13.56 MHz, and a power of 30 to 500 W. The cleaning conditions are not restricted to the above, and other conditions may also provide the effect of this invention.

Figure 3:
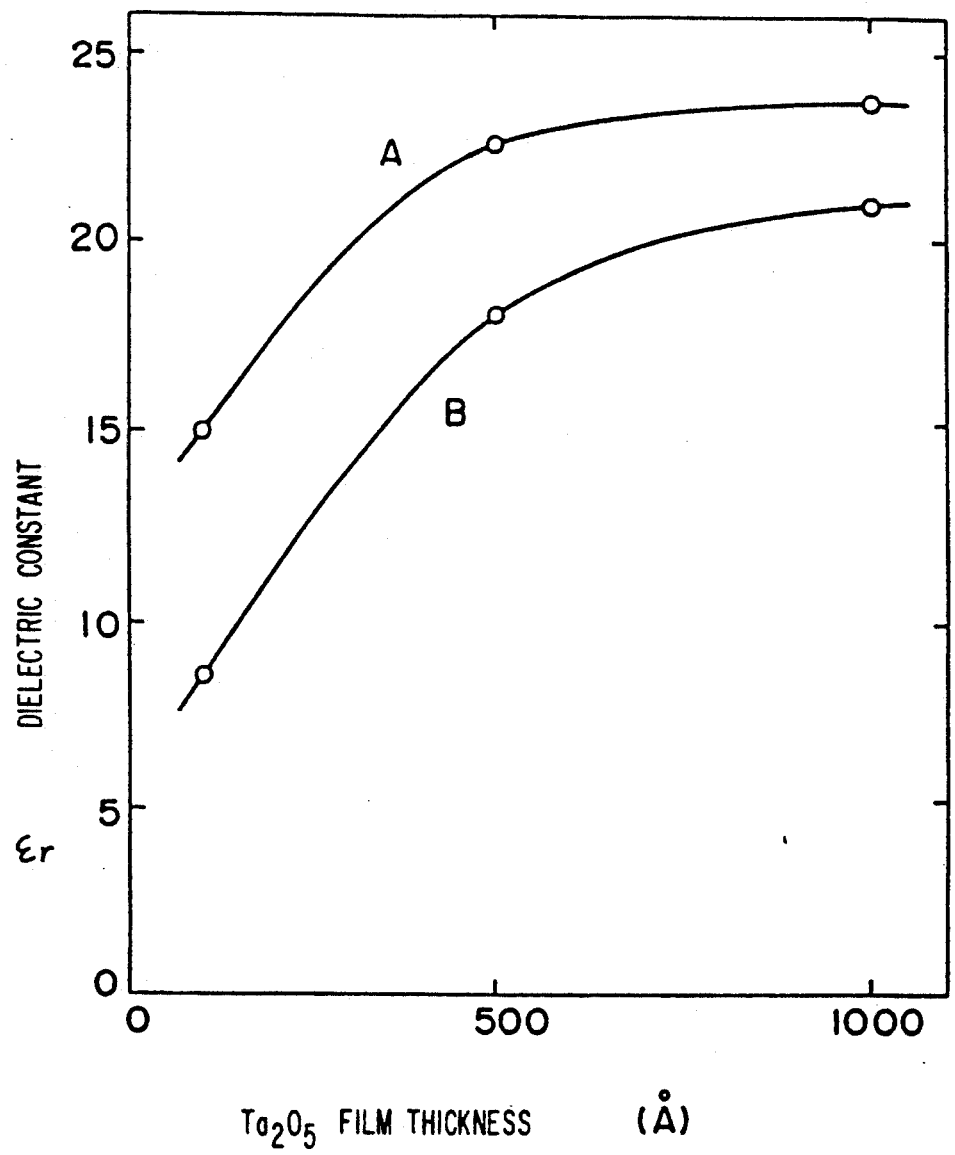
FIG. 3 is a graph representing changes in dielectric constant $\epsilon_r$ versus the thicknesses of tantalum oxide films formed according to this embodiment and the prior art.

FIG. 3 is a graph showing the relationship between the thickness and the dielectric constant $\epsilon_r$ of tantalum oxide films formed by the process according to this embodiment and the prior art process. Referring to FIG. 3, the curve A represents a change in dielectric constant $\epsilon_r$ versus the thickness of the tantalum oxide film formed by the process according to this embodiment, while the curve B represents a change in dielectric constant $\epsilon_r$ versus the thickness of the tantalum oxide film formed by the prior art process. It is apparent from this graph that the tantalum oxide film formed by the process according to this embodiment has a greater dielectric constant $\epsilon_r$ than the one formed by the prior art process. Particularly, for a very thin film thickness of about 100 Å needed in a VLSI DRAM of a 64-M size or greater, the tantalum oxide film formed by the process according to this embodiment has a dielectric constant $\epsilon_r$ about 1.5 times higher than the conventional one. This is because, as described earlier, a thick oxide film ($SiO_2$) with a thickness of about 30 to 40 Å is formed at the interface between the tantalum oxide film and the silicon substrate at the initial stage of reaction, thus reducing the dielectric constant $\epsilon_r$, whereas, according to this embodiment, the oxide film formed near the interface is extremely thin, 10 Å or below, thus suppressing reduction of the dielectric constant.

Figure 4A:
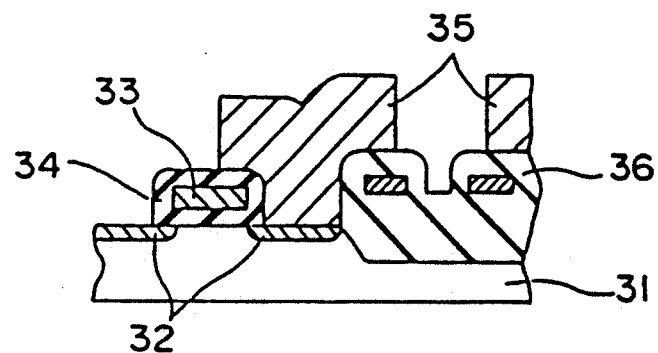
FIGS. 4A to 4C show cross sections illustrating a process of fabricating a capacitive device stepwise.
Figure 4B:
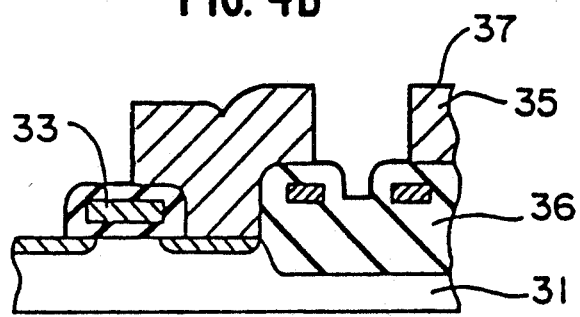
Figure 4C:
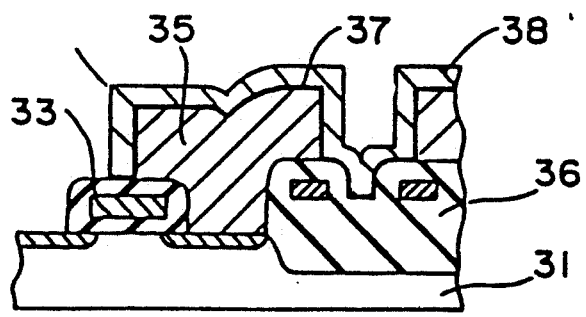

The embodiment of the present invention as applied to fabrication of a capacitive device will now be described. FIGS. 4A to 4C show cross sections of a device, illustrating a process of fabricating the device stepwise.

As shown in FIG. 4A, an oxide film 36 for device isolation is formed on the surface of a silicon substrate 31. A gate electrode 33 is located in a device area surrounded by the device-isolating oxide film 36, and is covered by an oxide film 34. An impurity diffusion layer 32 is formed on the surface of the silicon substrate 31, self-aligned with the gate electrode 33. A phosphorous-doped stack polysilicon film 35 is deposited on the silicon substrate 31, and is patterned in a predetermined form.

The device shown in FIG. 4A is placed in the forming apparatus in FIG. 2. An oxide tantalum film is formed by thermochemical reaction between organic tantalum charge gas and oxygen gas, and then an oxide tantalum film is further formed by plasma chemical reaction, using tantalum halogenide charge gas and nitrous oxide gas. As a result, a capacitive insulating film 37 is formed on the whole surface of the structure, as shown in FIG. 4B.

The forming conditions for the capacitive insulating film are as described before.

As shown in FIG. 4C, a tungsten film is adhered to the whole surface, and is patterned to form a plate electrode 38. Using this plate electrode 38 as a mask, the capacitive insulating film 37 is selectively removed, thus yielding a capacitive memory cell.

FIG. 5 is a graph showing changes in capacitance versus the cell size of the capacitive memory cell produced through the above procedures. The curve A in FIG. 5 indicates a change in capacitance in the case of using the capacitive insulating film formed by the process according to this embodiment, while the curve B indicates a change in the case of using the capacitive insulating film formed by the prior art process. As apparent from the graph in FIG. 5, the capacitance of the tantalum oxide film according to this embodiment is about 1.5 times as large as that of the conventional film. For the cell size of 1.6 $\mu^2$ that is used in a 64-M DRAM, the obtained capacitance of 30 fF is high enough to prevent software errors due to $\alpha$ rays.

What is claimed is:

1. A process of forming a capacitive insulating film, comprising the steps of:
    forming a tantalum oxide film through thermochemical reaction involving organic tantalum charge gas and oxygen gas; and
    subsequently forming a tantalum oxide film through plasma chemical reaction involving tantalum halogenide charge gas and nitrous oxide ($N_2O$) gas, said steps being performed in the same apparatus on the same substrate to form a lower tantalum oxide film and an upper tantalum oxide film.

2. A process according to claim 1, wherein hydrogen gas is used together with the oxygen gas and the nitrous oxide gas.

3. A process according to claim 1, wherein the reaction chamber is cleaned by plasma chemical reaction using fluorine series halogenide compound gas.

* * * * *